(12) United States Patent
Shannon

(10) Patent No.: US 6,452,516 B1
(45) Date of Patent: Sep. 17, 2002

(54) SYSTEM AND METHOD FOR ENCODING AND DECODING DATA

(75) Inventor: Terrence M. Shannon, Kuna, ID (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/820,493

(22) Filed: Mar. 28, 2001

(51) Int. Cl.[7] .................................................. H03M 7/40
(52) U.S. Cl. ........................................................ 341/65
(58) Field of Search ............................. 341/67, 65, 81, 341/106

(56) References Cited

U.S. PATENT DOCUMENTS 5,351,047 A * 9/1994 Behlen ........................ 341/67

* cited by examiner

Primary Examiner—Brian Young
(74) Attorney, Agent, or Firm—Matthew L. Wade

(57) ABSTRACT

A computer operable to encode a string of tokens is described. The computer operates to identify a group of tokens in the string. The identified group of tokens are those tokens that follow a token having a first value. The computer further operates to assign a Huffman codeword to each token value present in the group. The Huffman codewords are assigned based upon the local frequencies of the group. The computer then operates to replace each token in the group with the codeword assigned to its value. The computer further operates to replace each token that is not a member of group with a codeword so as to generate a string of Huffman codewords that is representative of the string of tokens.

21 Claims, 10 Drawing Sheets

SYSTEM AND METHOD FOR ENCODING AND DECODING DATA

CROSS-REFERENCES

This application is related to the application having attorney's docket number 10012522, filed on the same date as this application, entitled "System and Method for Compressing Data", Ser. No. 09/820,494 by inventor Terrence Shannon. That application is incorporated herein by this reference.

BACKGROUND OF THE INVENTION

Data is often compressed in order to reduce computer memory requirements or to reduce transmission time. One popular data compression technique may be referred to as "entropy coding".

Huffman coding is one example of an entropy coding technique. A Huffman encoder will typically utilize a Huffman statistical model to convert a string of tokens into a series of variable length entropy codes. The Huffman encoder operates to assign short entropy codes to the tokens that occur most often and longer code words to the tokens that occur least often. The code words that are used in Huffman encoding are typically obtained from one or more tables, known as Huffman Tables.

While prior art entropy coding techniques have proven to be very useful, improvements in these techniques are always needed in order to reduce the memory requirements of computing systems as well as to improve the speed at which data can be communicated from one computer to another.

Other aspects and advantages of the present invention will become apparent from the following detailed description, taken in conjunction with the accompanying drawings, illustrating by way of the example the principles of the invention.

SUMMARY OF THE INVENTION

The present invention may be implemented as a method of encoding a string of tokens. In one embodiment, the string of tokens includes a first group of tokens that immediately follow a token having a first value. The method includes the step of generating a Huffman encoded string by, at least in part, Huffman encoding the first group based upon the local frequencies of the first group.

The present invention may also be implemented as an apparatus for encoding a string of tokens. In one embodiment, the apparatus is operable to identify a first group of tokens in the string. The first group of tokens being those tokens in the string that immediately follow a token having a first value. The apparatus is further operable to assign a Huffman codeword to each token value that occurs in the first group based upon the local frequencies of the first group.

The present invention may also be implemented as a program storage medium. In one embodiment, the program storage medium embodies a program of instruction executable by a computer to perform method steps for encoding a string of tokens. The string of tokens includes a first group of interspersed tokens each having a first value. The method steps may include identifying a second group of tokens in the string each immediately following a unique one of tokens in the first group; and Huffman encoding the string in part by Huffman encoding the second group of tokens based upon the local frequencies of the second group.

Other aspects and advantages of the present invention will become apparent from the following detailed description, taken in conjunction with the accompanying drawings, illustrating by way of example the principles of the invention.

BRIEF DESCRIPTION OF THE DRAWINGS

The invention can be understood with reference to the following drawings. The drawings are not necessarily to scale.

DETAILED DESCRIPTION OF THE INVENTION

A number of computing systems generate token strings wherein an identifiable subset of tokens, interspersed throughout the string, exhibit a non-random frequency distribution that is different than the frequency distribution of the string itself. As will be illustrated in the following exemplary embodiment, the present invention provides a new and advantageous way to encode such strings in an efficient manner.

Figure 1:
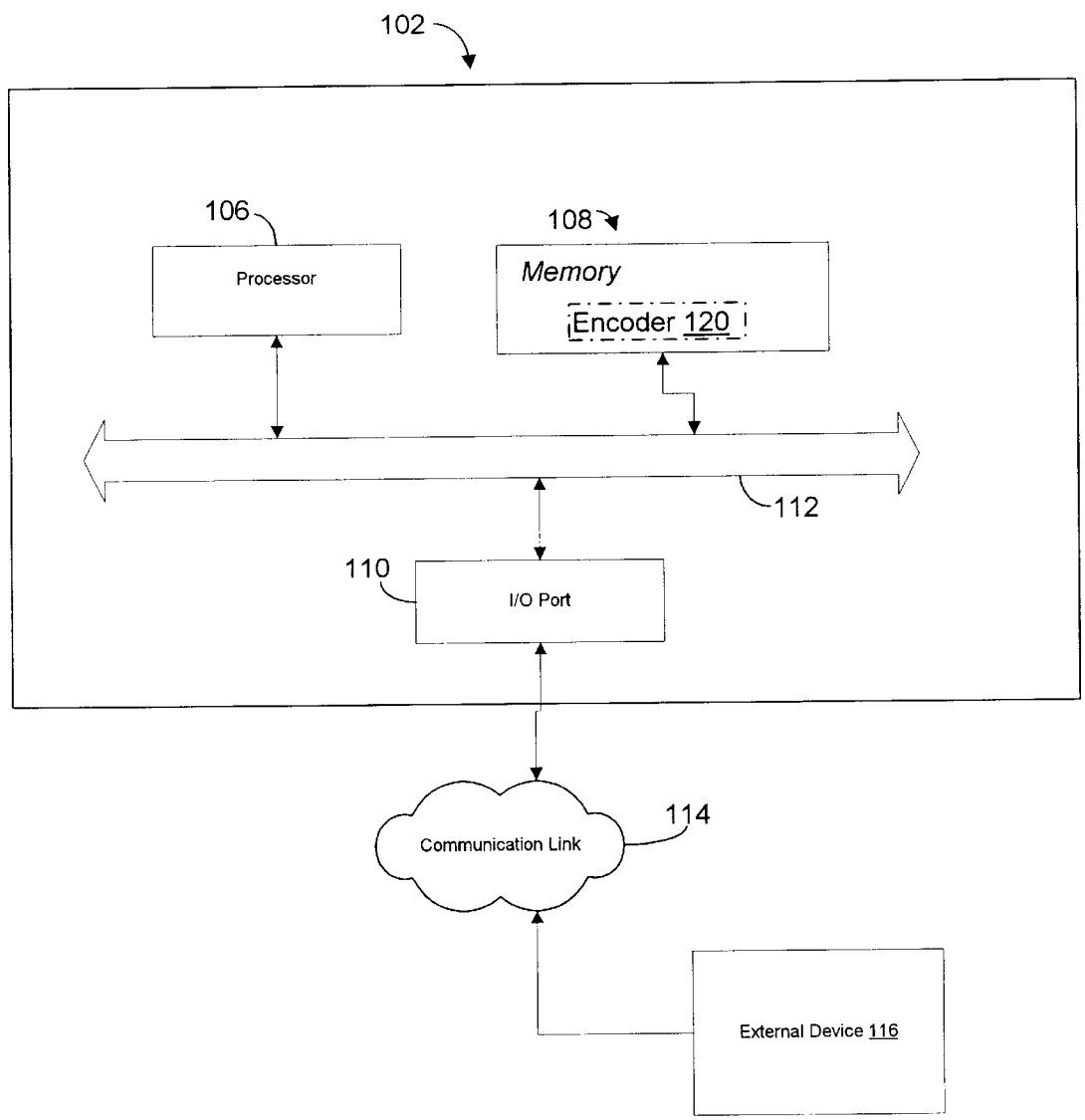
FIG. 1 is a block diagram of a computing system, for example, according to the invention.

As shown in FIG. 1, for purposes of illustration, the invention is embodied in a computer 102 that encodes tokens strings that may be received, for example, from an external device 116. The computer 102 is further operable to encode token strings that are internally generated.

The computer 102 includes a processor 106, a memory 108 and an I/O port 110. All these devices are connected via a local interface 112. The local interface 112 may include, for example, one or more data buses with accompanying control buses. The I/O port 110 facilitates communications with the external device 116 via a communication link 114. The communication link 114 may represent a network such as an Intranet or the INTERNET. The communication link 114 may also represent a parallel port or a serial port. The external device 116 may represent any type of device that can transmit a string of tokens to the computer 102.

The processor 106 is used to execute programs that are stored in the memory 108. One of these programs is an encoder program 120. As will be explained in greater detail below, the encoder 120 enables the computer 102 to Huffman encode token strings received, for example, from the external device 116.

Figure 2A:
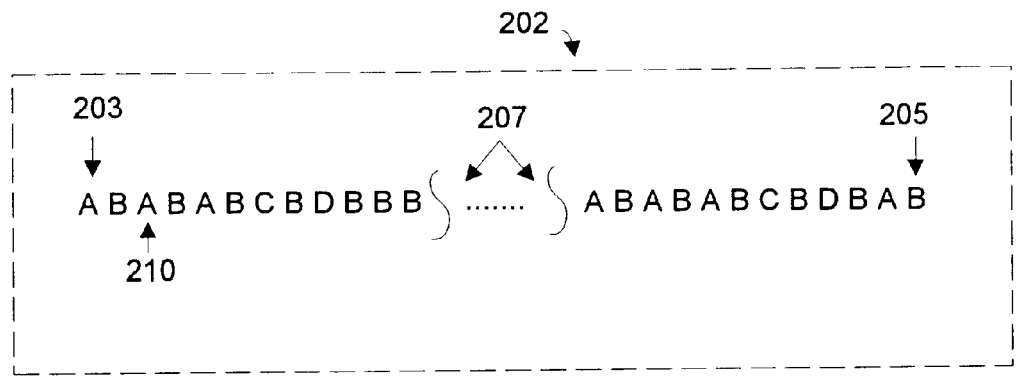
FIG. 2A shows a typical token string received by a computer in the system from an external device.

FIG. 2A illustrates a typical token string 202 received by the computer 102 from the external device 116. The first token 203 and the last token 205 in the string 202 are designated as shown. Many tokens in the string 202 are not shown but are represented by section 207.

Figure 2B:
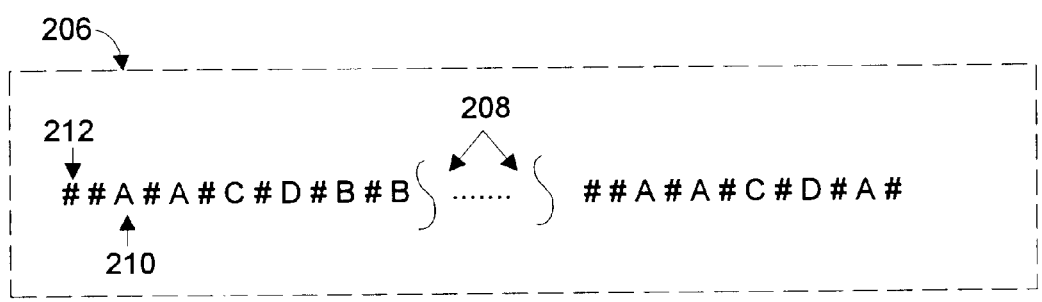
FIG. 2B illustrates a group of certain tokens in the string.

FIG. 2B illustrates a group of certain tokens (group 206) in the string 202 that meet certain criteria. In particular, the members of the group 206 are those tokens in the string 202 that immediately follow a "B" token. The locations of those tokens that are not members of the group 206 are represented by a "#" sign. Thus, for example, because token 210 immediately follows a "B" token, that token is shown as being a member of the group 206. The first token 203 is not a member of the group 206 and is represented by a # sign 212.

For ease of discussion, the phrase "local frequencies" of a given group refers to the frequency of occurrence of each token value in that group. Thus, the "local frequencies" of the group 206, for example, refers to the number of times each token value occurs in the group 206. The phrase "local frequency" of a particular token value in a group refers to the number of times that token value occurs in the group. Thus, for example, the local frequency of token value "A" in the group 206 refers to the number of times token value "A" occurs in the group 206.

Furthermore, the phrase "aggregate frequencies" of a string refers to the number of time each token value occurs in the string. The aggregate frequency of a token value in a string refers to the number of times that token value occurs in the string. Thus, for example, the "aggregate frequencies" of the string 202 refers to the number of times each token value occurs in the string 202. The aggregate frequency of token value "A" is the number of times token value "A" occurs in the string 202.

Figure 3A:
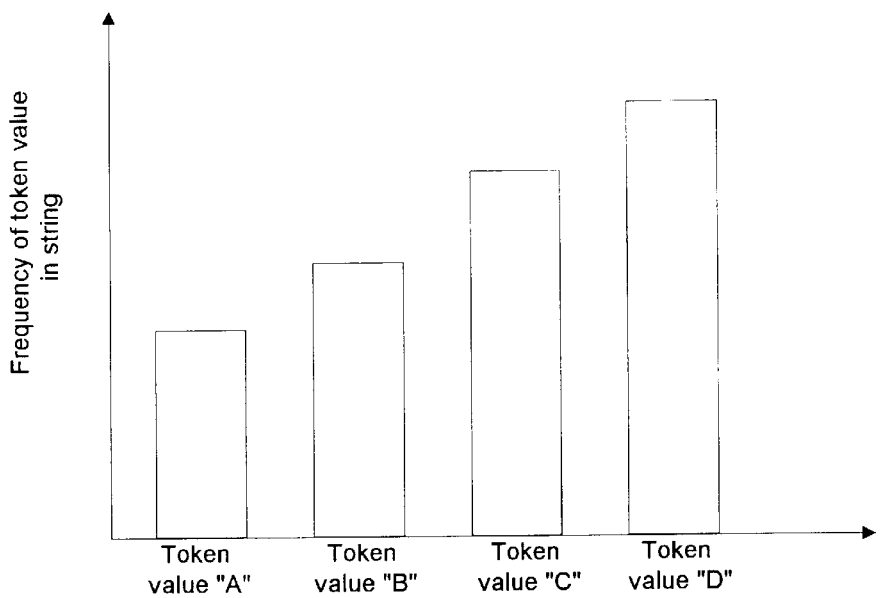
FIG. 3A illustrates generally the frequency distribution of the string.
Figure 3B:
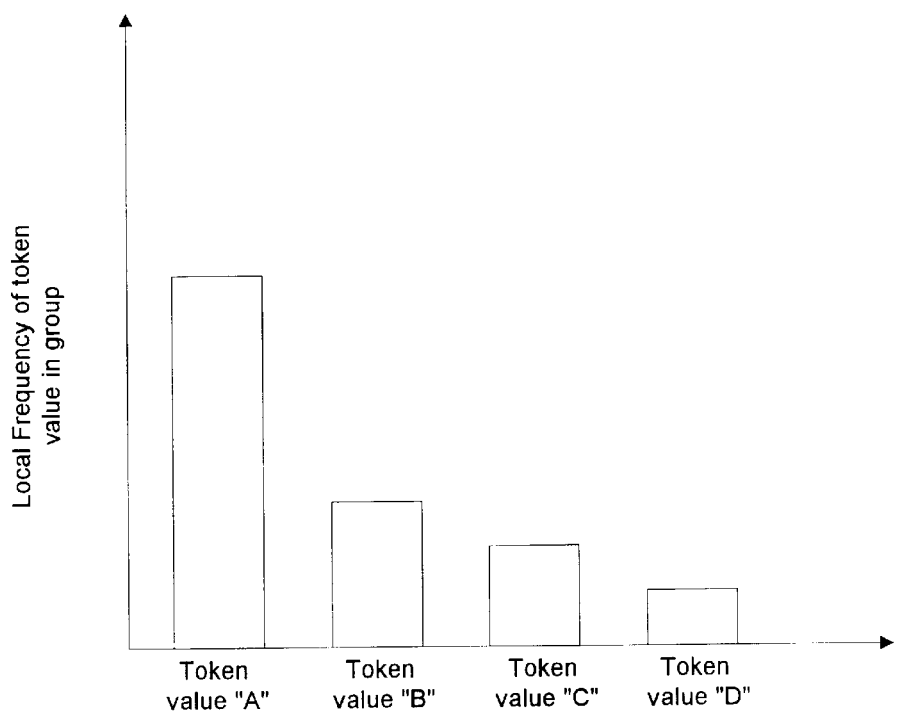
FIG. 3B illustrates generally the frequency distribution of the group.

FIG. 3A illustrates the aggregate frequency distribution of the string 202. FIG. 3B illustrates the local frequency distribution of the group 206. The reader should notice two things. First, the two distributions are both non-random. Secondly, the two distributions are significantly different. The significance of these two observations will be discussed in greater detail below.

Figure 4A:
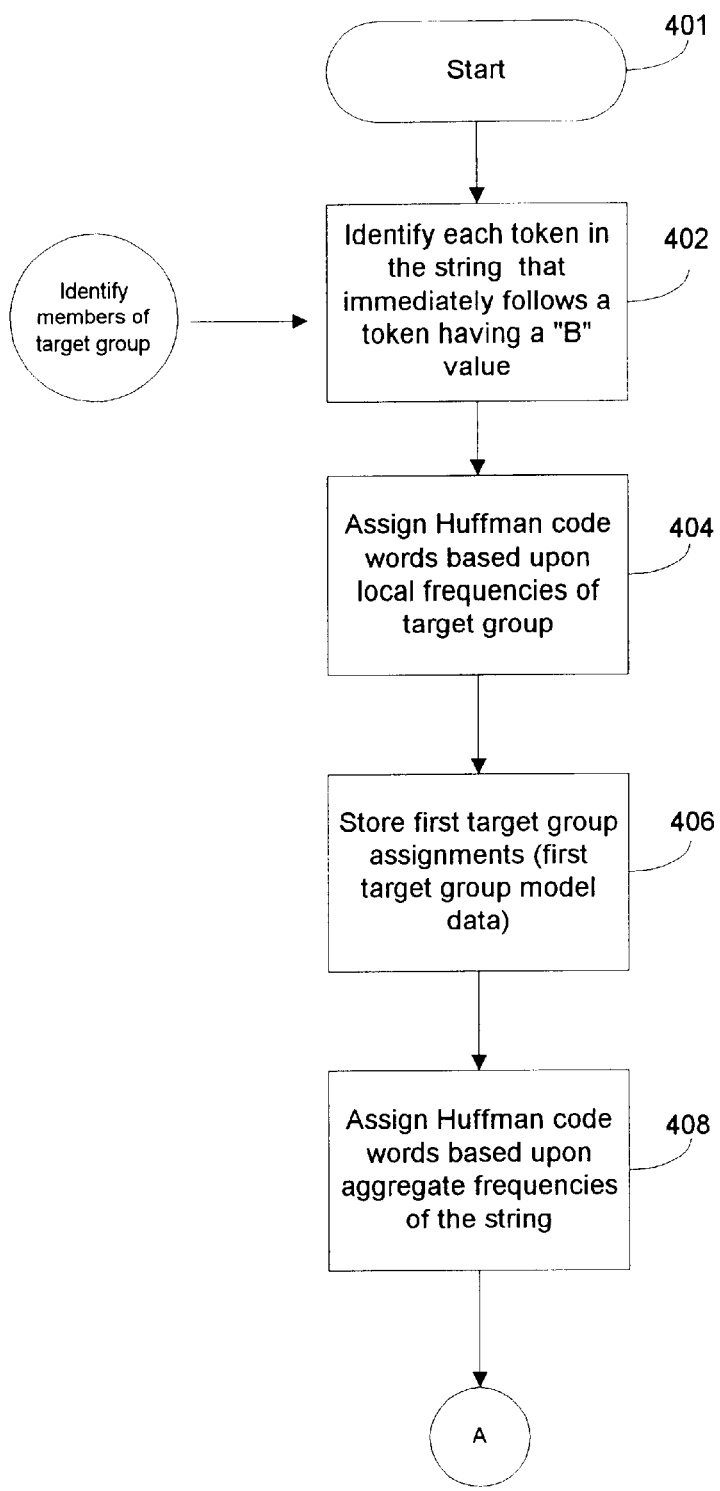
FIGS. 4A and 4B are flow diagrams illustrating the encoding procedure followed by the computer to encode a string of tokens.
Figure 4B:
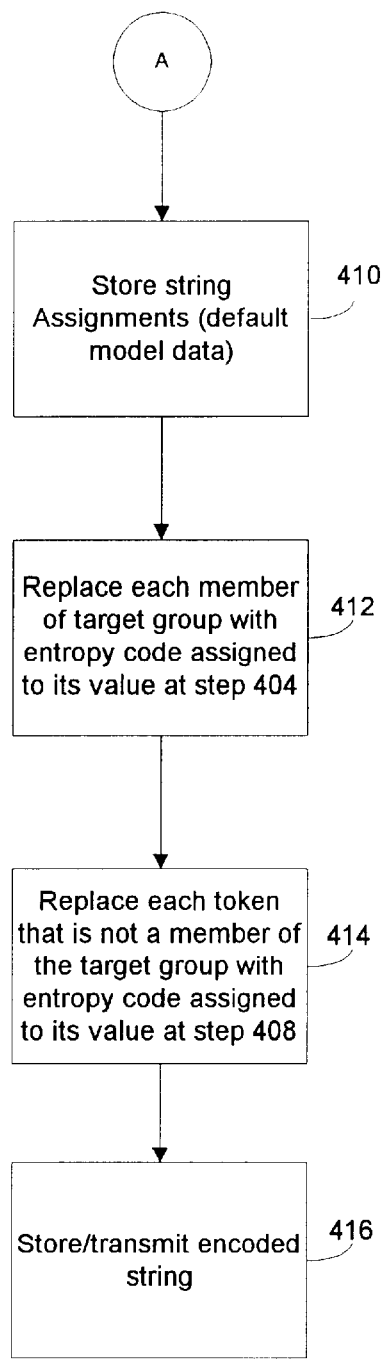

FIG. 4A and FIG. 4B illustrates the procedure followed by the computer 102, under the direction of the encoder program 120, to encode a string of tokens received from the external device 116. The computer 102 operates to receive the string at step 401. At step 402, the computer 102 operates to identify each token in the string that immediately follows a "B" token. We will refer to the group of tokens identified at step 402 as the "target group".

Thus, if the string 202 were the string being encoded, the members of the group 206 would be identified at step 402. Further, the group 206 would be the "target group" for the string 202.

At 404, the computer 102 operates to assign a Huffman code word to each token value that occurs in the target group. Importantly, the Huffman codes are assigned based upon the local frequencies of the target group. Thus, for example, if the "A" token value occurs the most often in the target group (as would be expected), that value is assigned the shortest Huffman code word.

At step 406, the computer 102 operates to store a first set of data describing these assignments. For ease of discussion, the assignments made at step 404 will be collectively referred to as the "target group Huffman model". The data describing these assignments will be referred to as the "target group model data".

At step 408, the computer 102 operates to assign a Huffman codeword to each token value that occurs in the string. Importantly, in this step the Huffman codes are based upon the aggregate frequencies of the string. Thus, for example, if the "D" token value occurs most often in the string (as would be expected), then that value is assigned the shortest Huffman codeword.

For ease of discussion, the assignment made at step 408 will referred to as the "default model". The data describing the default model (generated at step 410) will be referred to as the "default model data".

At step 412, the computer 102 operates to replace each member of the target group with the entropy code assigned to its value at step 404. At step 414, the computer 102 operates to replace each token in the string that is not a member of the target group with an entropy code assigned to its value at step 408.

The reader will see that after the computer 102 has performed step 412 and step 414, the string is now Huffman encoded. The computer 102 may then store the encoded string or transmit it to another device for further processing (step 416).

To illustrate the benefit that can be obtained by encoding a string of tokens using the above procedure lets now consider a simple example. Assume that the computer 102 receives the string 202 and encodes it using the procedure just described. It will be assumed that the aggregate frequencies of the string 202 are as listed in table 1.

TABLE 1

| Token Value | Aggregate Frequency (number of occurrences in string) |
| --- | --- |
| A | 100 |
| B | 200 |
| C | 300 |
| D | 400 |

At step 402, the computer 102 identifies those tokens that follow a "B" token. Thus, the computer 102 identifies the group 206 depicted in FIG. 2B. The group 206 is, therefore, the "target group" in this particular case.

We will assume that the local frequencies of the group 206 are as listed in table 2.

TABLE 2

| Token Value | Local Frequency (number of occurrences of each token value in target group) |
| --- | --- |
| A | 98 |
| B | 12 |
| C | 10 |
| D | 5 |

At step 404, the computer 102 assigns Huffman codes based upon the local frequencies of the group 206. Table 3 illustrates the assignments that would be made based upon these frequencies.

TABLE 3

| Token value | Huffman Code (based upon local frequencies of the target group) |
|---|---|
| A | 0 |
| B | 10 |
| C | 110 |
| D | 111 |

At step 406, the computer 102 generates and stores data describing the assignments indicated by Table 3. Thus, the assignments indicated in table 3 is the "target group model" for this particular case. The data generated to describe these assignments is the "target group model data".

At step 408, the computer 102 assigns a Huffman codeword to each token value based upon the aggregate frequencies of the string 202. Table 4 illustrates the assignments that would be made based upon the frequencies illustrated in table 1.

TABLE 4

| Token value | Huffman Code (based upon aggregate frequencies of the string) |
|---|---|
| A | 111 |
| B | 110 |
| C | 10 |
| D | 0 |

At step 410, the computer 102 stores the data describing the assignments indicated in table 4. Thus, the assignments indicated in table 4 is the "default Huffman model" for this particular case. The data generated and stored at step 410 to describe the default Huffman model is the "default Huffman model data".

At step 412, the computer 102 replaces each member of the group 206 with the entropy code assigned to its value at step 404. At step 414, the computer 102 replaces each non-member of the group 206 with the entropy code assigned to its value at step 408.

Figure 5:
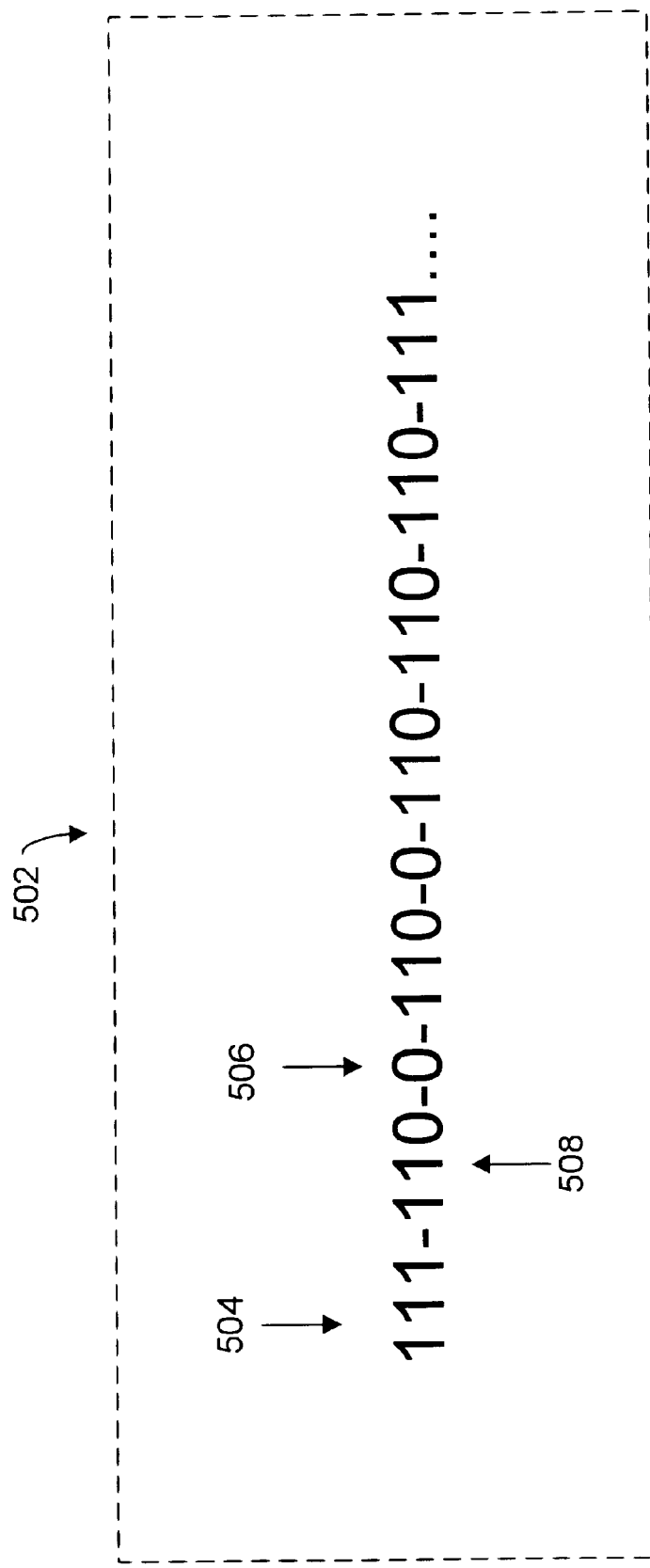
FIG. 5 illustrates a portion of the string of codewords after each token in a string is replaced with a codeword according to the encoding procedure.

FIG. 5 illustrates the string of codewords after each token in the string 202 is replaced with a codeword at steps 412 and step 414. The reader will note, for example, that the first token 203 in the string 202 is replaced with a codeword 504 according to the default Huffman model because that token is not a member of the group 206. The token 210 is a member of the group 206 and is therefore replaced with a codeword 506 according to the "target group Huffman model".

A person skilled in the art will note that if the string 202 had been encoded according to one prior art Huffman encoding procedure, the entire string 202 (including the members of the target group) would be Huffman encoded based only upon the string's aggregate frequencies. That is to say, the members of the target group would not have been encoded as an independent group. Thus, it can be seen from the foregoing example that the invention allows the developer to "tune" the encoding procedure so as to take advantage of certain local frequency distributions of one or more groups of tokens in a string. As just demonstrated, this can result in improving the overall compression of the string.

Figure 6:
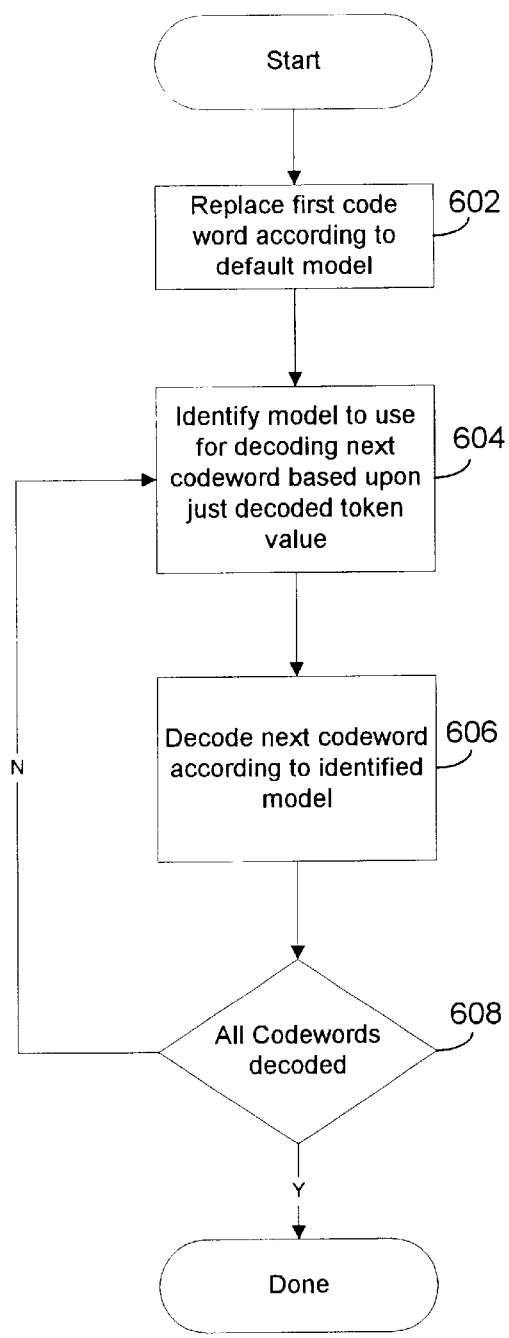
FIG. 6 is a flow diagram illustrating a decoding procedure, for example, according to another implementation of the invention.

FIG. 6 illustrates a second exemplary embodiment of the invention of the form of a decoding procedure that may be performed by a computer to decode a string of codewords. It is assumed that the string of codewords was originally encoded according to the inventive procedure just described. Furthermore, for illustration purposes, the steps in FIG. 6 will be discussed as applied to decoding the encoded string 502.

At step 602, the computer replaces the first codeword in the encoded string and replaces it with the corresponding token value according to the default model (as described by the default Huffman model data). Thus, in this case, the codeword 504 is replaced with an "A" token value.

At step 604, the computer identifies which model to use to decode the next codeword in the string. Importantly, this step is based upon the value of the just decoded token. If the just decoded token is a "B" value, then the computer determines that the next codeword should be decoded according to the target group Huffman model (as described by the target group Huffman model data). If, however, the just decoded token is not a "B" value, the computer determines that the next codeword should be decoded according to the default Huffman model.

At step 606, the computer replaces the next codeword in the string with a token value according to the model identified at step 604. Thus, in this first iteration, because the just decoded token value is an "A" value, the computer replaces the codeword 508 with a token value according to the default Huffman model. The codeword 508 is replaced, therefore, with a "B" value.

After the codeword is replaced, the computer then determines if all the codewords have been decoded (decision step 608). If not, then the computer repeats steps 604–606. Thus, in the second iteration, the codeword 506 is replaced with an "A" value according to the target group Huffman model.

When the last codeword is replaced with a token value, the procedure ends as the string is now decoded.

It is important to note that the present invention can be used to improve data compression in many different types of computing systems. For example, the present invention may be incorporated in various types of imaging and printing systems. Additionally, more then one "target group" may be identified and encoded based upon the respective group's local frequencies. To illustrate these two aspects of the invention, consider the next exemplary embodiment of the invention depicted in FIG. 7.

Figure 7:
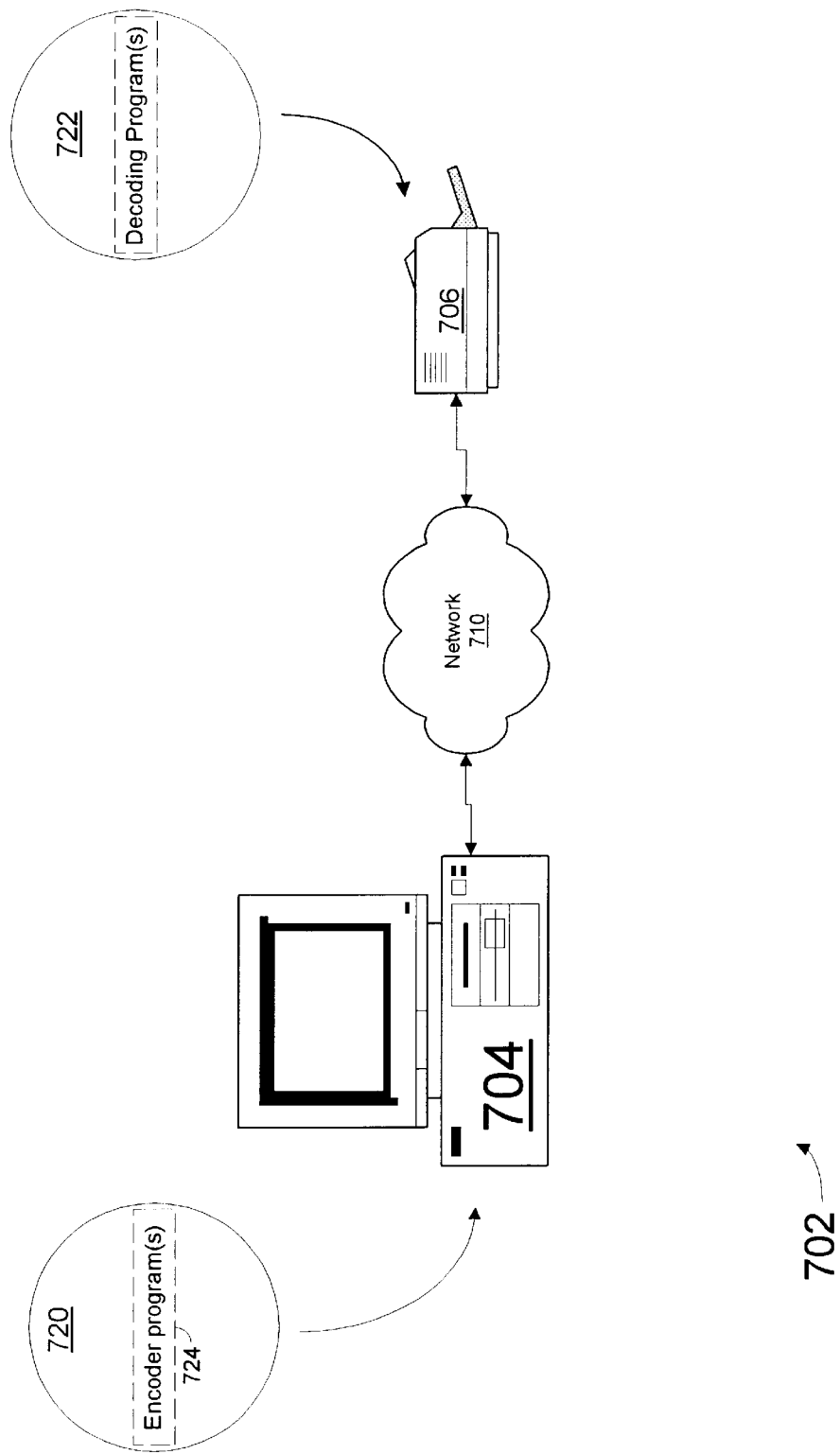
FIG. 7 depicts a second computing system, for example, according to another implementation of the invention.

FIG. 7 depicts a computing system 702 that incorporates another exemplary embodiment of the invention. The computing system 702 includes a general purpose computer 704 connected to a printer 706 over a network 710. The general purpose computer 704 is operative to generate a string of tokens that describes a digital image.

Also depicted in FIG. 7 is a first storage medium 720 and a second storage medium 722. The first storage medium 720 includes an encoder program 724 stored therein. The encoder program 724 is computer readable code for causing a computer, such as a computer 704, to perform the steps depicted in FIG. 8 to encode a string of tokens.

The second storage medium 722 includes a decoder program 726 stored therein. The decoder program 726 is for causing a computerized device, such as the printer 706, to perform the procedure described in FIG. 9 to decode a string of code words.

Figure 8:
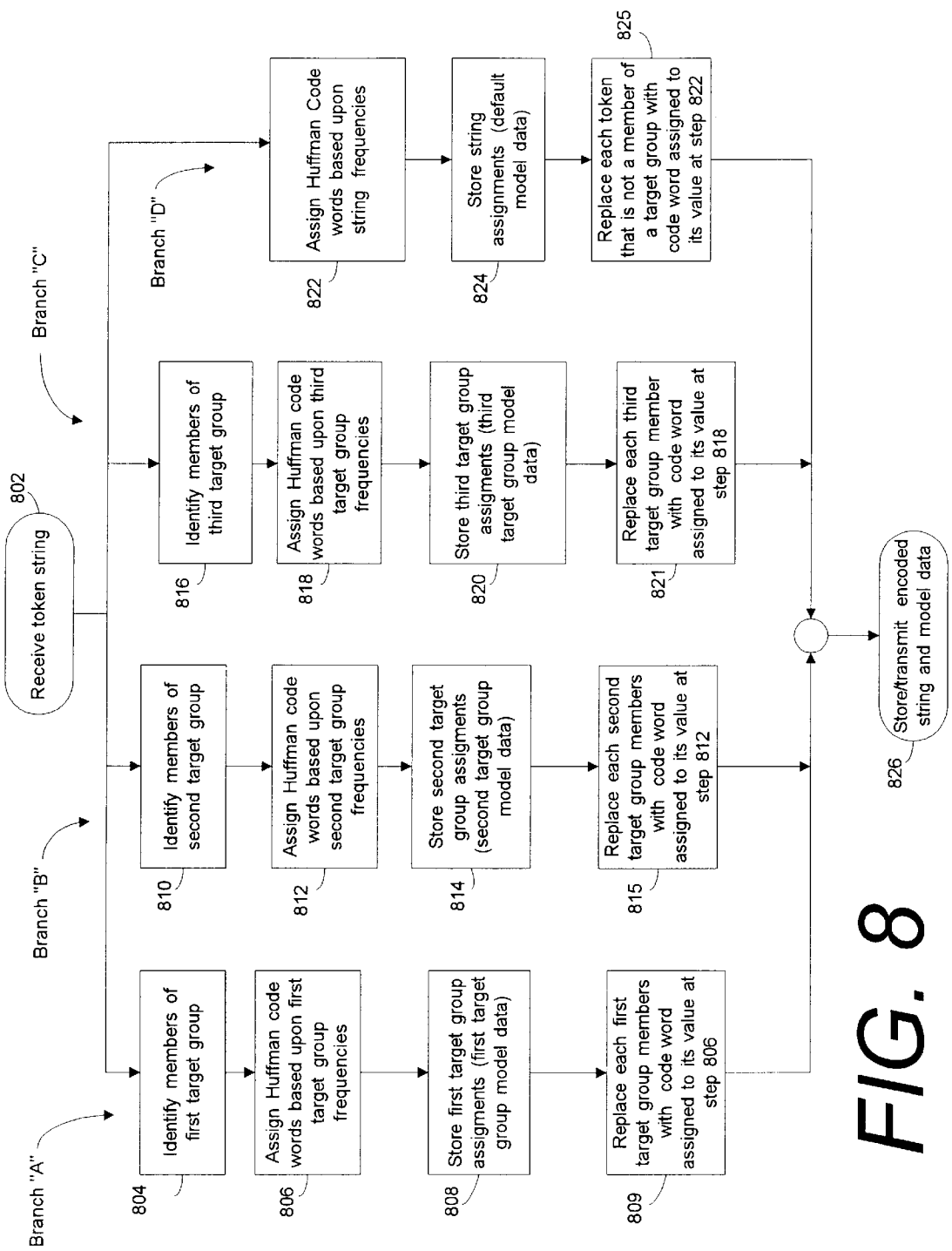
FIG. 8 is a flow diagram illustrating an encoding procedure followed by a computer in the second computing system to encode a string of tokens.

Referring now to FIG. 8, it will be assumed that the encoder program 724 is loaded in the computer 704 and is then executed by the computer 704 to encode a string of tokens previously generated. It is further assumed that the string describes an image that is to be printed. It is within this context that the steps shown in FIG. 8 are now described.

At step 802, the computer 704 receives and begins encoding a string of tokens.

Branch A (steps 804–809) At step 804, the computer 704 operates to identify each member of a first target group. In this example, the first target group are those tokens in the string that immediately follow an "A" token value. Thus, the first target group may be referred to as having an "A" token reference value.

At step 806, the computer 704 operates to assign Huffman code words to each token value that occurs in the first target group. Importantly, the codewords are assigned according to the Huffman encoding process based upon the local frequencies of the first target group.

At step 808, the computer 704 generates data describing these assignments and stores the data. The assignments made at step 806 will be referred to as the "first target group model data". The data stored at step 808 will be referred to as "first target group model data".

At step 809, the computer 704 operates to replace each member of the first target group with the codeword assigned to its value at step 806.

Branch B (steps 810–815)

At step 810, the computer 704 operates to identify each member of a second target group. In this example, the second target group are those tokens in the string that immediately follow a "B" token. Thus, the second target group may be referred to as having a "B" token reference value.

At step 812, the computer 704 operates to assign Huffman code words to each token value that occurs in the second target group. Importantly, the codewords are assigned according to the Huffman encoding process based upon the local frequencies of the second target group.

At step 814, the computer 704 generates data describing these assignments and stores the data. The data stored at step 814 will be referred to as the "second target group model data".

The assignments made at step 812 will be referred to as the "second target group model data". The data stored at step 814 will be referred to as "second target group model data".

At step 815, the computer 704 operates to replace each member of the second target group with the code word assigned to its value at step 812.

Branch C (steps 816–821)

At step 816, the computer 704 operates to identify each member of a third target group. In this example, the third target group are those tokens in the string that immediately follow a "C" token. Thus, third target group may be referred to as having a "C" token reference value.

At step 818, the computer 704 operates to assign Huffman code words to each token value that occurs in the third target group. Importantly, the codewords are assigned according to the Huffman encoding process based upon the local frequencies of the third target group.

At step 820, the computer 704 generates data describing these assignments and stores this data. The assignments made at step 818 will be referred to as the "third target group model". The data generated and stored at step 820 will be referred to as "third target group model data".

At step 821, the computer 704 operates to replace each member of the third target group with the code word assigned to its value at step 818.

Branch D (step 822–825)

At step 822, the computer 704 operates to assign Huffman code words to each token value that occurs in the string. Importantly, in this embodiment, these codewords are assigned based upon the aggregate frequencies of the string.

It is noted that in alternative embodiments, the codewords are assigned based upon the local frequencies of a fourth target group. The fourth target group consisting of those tokens in the string that are not members of the first, second and third target groups.

At step 824, the computer 704 generates data describing these assignments and stores this data. The assignments made at step 822 will be referred to as the "default Huffman model". The data stored at step 824 will be referred to as "default model data".

At step 825, the computer 704 operates to replace each token in the string which are not members of a target group with the code word assigned to its value at step 822.

After performing steps 809, 815, 821 and 825 the string is encoded. At step 826 the computer stores the encoded string and transmits it, along with the model data, to the printer 706 for printing.

The reader will note that in the procedure just described three different target groups are identified in the string and encoded based upon their respective local frequencies. In this example, this is considered advantageous as all three target groups will typically have non-random frequency distributions that are significantly different than the frequency distribution of the string.

Now lets consider how the printer 706 operates, under the direction of the decoder program 726, to decode an encoded string received from the computer 704.

Figure 9:
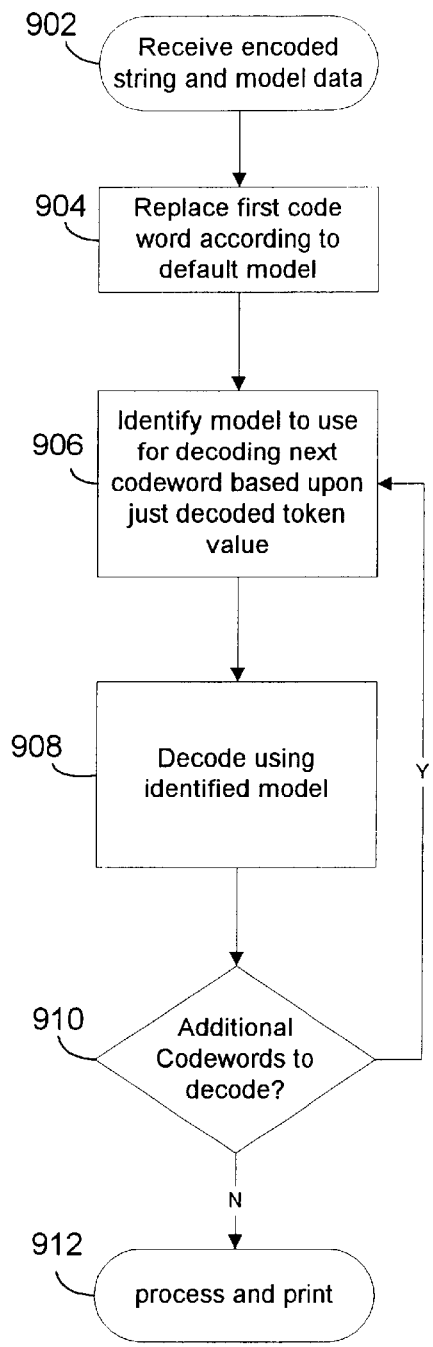
FIG. 9 is a flow diagram illustrating a decoding procedure followed a printer in the second computing system to decode a string of codewords.

Referring now to FIG. 9, at step 902 the printer 706 receives the string and the model data. At step 904, the printer 706 replaces the first codeword with a token value according to the default Huffman model.

At step 906, the printer 706 then identifies the Huffman model to use for decoding the next codeword. If the just decoded token value is an "A" value, the printer 706 determines that the next codeword should be decoded according to the first target group model. If the just decoded token is a "B" value, then the printer 706 determines that the next codeword should be decoded according to the second target group model. If the just decoded token is a "C" value, then the printer 706 determines that the next codeword should be decoded according to the third target group model. If the just decoded token is not an "A", "B" or "C" value, then the printer 706 determines that the next codeword should be decoded according to the default Huffman model.

At step 908, the printer 706 replaces the next codeword with a token value according to the model identified at step 906.

After the codeword is decoded, the printer 706 determines if there are additional codewords in the string to decode (decision step 910). If so, then the printer 706 operates to repeat steps 906-910. This continues until all the codewords have been decoded into tokens.

At step 912, the decoding procedure ends and the printer 706 proceeds to further process the decoded token string and print the image represented by the decoded token string.

It is noted that in the first embodiment, the memory 108 may represent both volatile and nonvolatile components. Volatile components are those that do not retain data upon loss of power. Nonvolatile components are those that retain data upon a loss of power. Thus, the memory 108 may comprise, for example, one or more of the following: random access memory (RAM), read only memory (ROM), hard disk drives, floppy disk drive, magnetic tapes accessed via an appropriate tape drive, optical storage media accessed via an appropriate drive, etc. In addition, the processor 106 may represent a single or multiple processors.

Furthermore, in the embodiments just described, the functionality provided by any one of the programs described may alternatively be provided in whole or in part by hardware components. For example, one or more of the steps illustrated in FIGS. 4A, 4B, 6, 8 and 9 could be performed by operation of an application specific integrated circuit having appropriate logic gates, a programmable gate array (s) (PGA) or a field programmable gate array (FPGA). Additionally, the programs are explained by reference to flow charts. It is understood that any of the steps depicted in these flow charts may be performed in a different sequence shown. In fact, some steps may be performed concurrently or with partial concurrence.

Furthermore, the present invention may be embodied in the form of a computer readable medium that has any one of the programs described above embodied therein. For example, the memory 108, the storage medium 720, and the store medium 722, may be considered embodiments of the invention. Importantly, the phrase "computer readable medium" can refer to any medium that can contain, store or propagate computer readable code. Thus, in this context, computer readable medium may refer to a tangible medium such as a CD ROM or an intangible medium, such as signals that are used to communicate the computer readable code over a network or the INTERNET.

From the foregoing it will be apparent that the invention provides a novel and advantageous method of encoding and decoding data that can be used in a variety of systems. Accordingly, although several specific embodiments of the invention has been described and illustrated, the invention is not to be limited to specific forms or arrangements of parts so described and illustrated. The invention is limited only by the claims and the equivalents thereof.

What is claimed is:

1. A method of encoding a string of tokens, comprising:

(a) identifying a first group of tokens in the string; and (b) Huffman encoding the string; and wherein the string includes a plurality of tokens each having a first value;

wherein each token in the first group immediately follows a different one of the first value tokens; and wherein step (b) includes Huffman encoding the first group of tokens based upon the local frequencies of the first group.

2. The method of claim 1, wherein the first group of tokens are interspersed throughout the string.

3. The method of claim 2, further comprising:

(c) identifying a second group of tokens in the string; and wherein the string includes a plurality of tokens each having a second value;

wherein each token in the second group immediately follows a different one of the second value tokens; and wherein step (b) further includes Huffman encoding the second group of tokens based upon the local frequencies of the second group.

4. The method of claim 1, wherein the Huffman encoding step is performed in part by Huffman encoding some of the tokens in the string based upon the aggregate frequencies of the string.

5. The method of claim 1, wherein the method is performed by a printer.

6. The method of claim 1, further comprising:

(b) storing the Huffman encoded string in memory; and (c) transmitting the Huffman encoded string.

7. Apparatus for encoding a string of tokens, comprising:

(a) means for identifying a first group of tokens in the string;

(b) first means for assigning a Huffman codeword to each token value that occurs in the first group based upon the local frequencies of the first group;

wherein the string includes a plurality of tokens each having a first value;

wherein at least some of the plurality of tokens are interspersed in the string;

wherein each token in the first group immediately follows a different one of the tokens from the plurality of tokens; and wherein step (b) includes Huffman encoding the first group of tokens based upon the local frequencies of the first group.

8. The apparatus of claim 7, further comprising:

(c) means for replacing each token in the first group with the codeword assigned to its value by the first assigning means.

9. The apparatus of claim 7, further comprising:

(d) means for identifying a second group of tokens in the string, the second group being those tokens that immediately follow a token having a second value;

(e) second means for assigning a Huffman codeword to each token value that occurs in the second group based upon the local frequencies of the second group; and (f) means for replacing each token in the first group with the codeword assigned to its value by the first assigning means and for replacing each token in the second group with the codeword assigned to its value by the second assigning means.

10. The apparatus of claim 9, further comprising:

(g) means for transmitting the encoded string to an external device.

11. The apparatus of claim 9, wherein the first and the second group of tokens are interspersed throughout the string.

12. The apparatus of claim 11, wherein the string describes an image and the apparatus further comprises;

(h) means for converting the encoded string into a printed form.

13. A program storage medium embodying a program of instruction executable by a computer to perform method steps for encoding a string of tokens including a first group of interspersed tokens each having a first value, the method steps comprising:

(a) identifying a second group of tokens in the string each immediately following a different one of the tokens in the first group;

(b) Huffman encoding the string in part by Huffman encoding the second group of tokens based upon the local frequencies of the second group.

14. The program storage medium of claim 13, wherein the string includes a third group of interspersed tokens each having a second value and the method steps further comprising:

(c) identifying a fourth group of tokens in the string, each immediately following a different one of the tokens in the third group; and wherein the Huffman encoding step is performed in part by Huffman encoding the fourth group of tokens based upon the local frequencies of the fourth group.

15. The program storage medium of claim 14, further comprising:

(d) storing the Huffman encoded string in memory.

16. The program storage medium of claim 14, further comprising:

(e) transmitting the Huffman encoded string to a computerized device.

17. A system for compressing a string of tokens, the system comprising:
   (a) means for identifying a first group of tokens in the string;
   (b) means for assigning a Huffman codeword to each token value present in the first group based upon the local frequencies of the first group; and
   (c) first means for replacing each token in the first group with the Huffman codeword assigned to its value by the assigning means; and
   wherein the string of tokens includes a set of tokens having a first value;
   wherein each token in the first group immediately follows a different one of the tokens from the set.

18. The system of claim 17, further comprising:
   (c) second means for replacing each token in the string that is not a member of the first group with a Huffman codeword; and
   (d) means for storing a string of codewords generated by the first and second replacing means.

19. The system of claim 18, further comprising:
   (e) means for decoding the string of codewords.

20. The system of claim 19, wherein the decoding means is incorporated in a printer.

21. The system of claim 20, wherein the string of tokens describes an image and further comprising:
   (f) means for decoding the string of codewords into the string of tokens;
   (g) means for converting the string into a printed form describing the image.

* * * * *